(12) United States Patent
Yang et al.

(10) Patent No.: US 9,461,184 B2
(45) Date of Patent: Oct. 4, 2016

(54) CAPACITOR AND SEMICONDUCTOR DEVICE USING SAME

(71) Applicant: Fitipower Integrated Technology, Inc., Hsinchu (TW)

(72) Inventors: Chun-Ping Yang, Hsinchu (TW); Da-Pong Zhang, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 126 days.

(21) Appl. No.: 14/049,269

(22) Filed: Oct. 9, 2013

(65) Prior Publication Data

US 2014/0117499 A1  May 1, 2014

(30) Foreign Application Priority Data

Oct. 31, 2012  (TW) .............................. 101140291 A

(51) Int. Cl.
*H01L 21/02* (2006.01)
*H01L 29/92* (2006.01)

(52) U.S. Cl.
CPC .................................. *H01L 29/92* (2013.01)

(58) Field of Classification Search
CPC ........................................................ H01L 29/92
USPC ........................................................ 257/597
See application file for complete search history.

(56) References Cited

U.S. PATENT DOCUMENTS

| | | | |
|---|---|---|---|
| 2008/0203496 A1* | 8/2008 | Takahashi | ...................... 257/409 |
| 2010/0109063 A1 | 5/2010 | Hayashida | |
| 2010/0252904 A1* | 10/2010 | Takahashi | ............. H01L 29/063 257/492 |

* cited by examiner

*Primary Examiner* — Mohsen Ahmadi
*Assistant Examiner* — Ismail Muse
(74) *Attorney, Agent, or Firm* — Zhigang Ma

(57) ABSTRACT

A capacitor for a semiconductor device includes a bottom electrode plate, an insulating layer formed on the bottom electrode plate, and a top electrode plate formed on the insulating layer. The bottom plate includes a capacitor well and at least one diffused region formed on the capacitor well. A doping concentration of the at least one diffused region is higher than a doping concentration of the capacitor well, the capacitor well comprising a first well.

17 Claims, 5 Drawing Sheets

CAPACITOR AND SEMICONDUCTOR DEVICE USING SAME

BACKGROUND

1. Technical Field

The present disclosure relates to a capacitor and a semiconductor device using the capacitor.

2. Description of Related Art

A capacitor is capable of receiving high voltages. However, once the capacitor operates in a depletion region and in an inversion region, a capacitance value of the capacitor may be apt to decrease a lot. As a result, quality of the capacitor and an integrated circuit chip employing the capacitor may deteriorate.

Therefore, it is desirable to provide a means which can overcome the above-mentioned problems.

DETAILED DESCRIPTION

Figure 1:
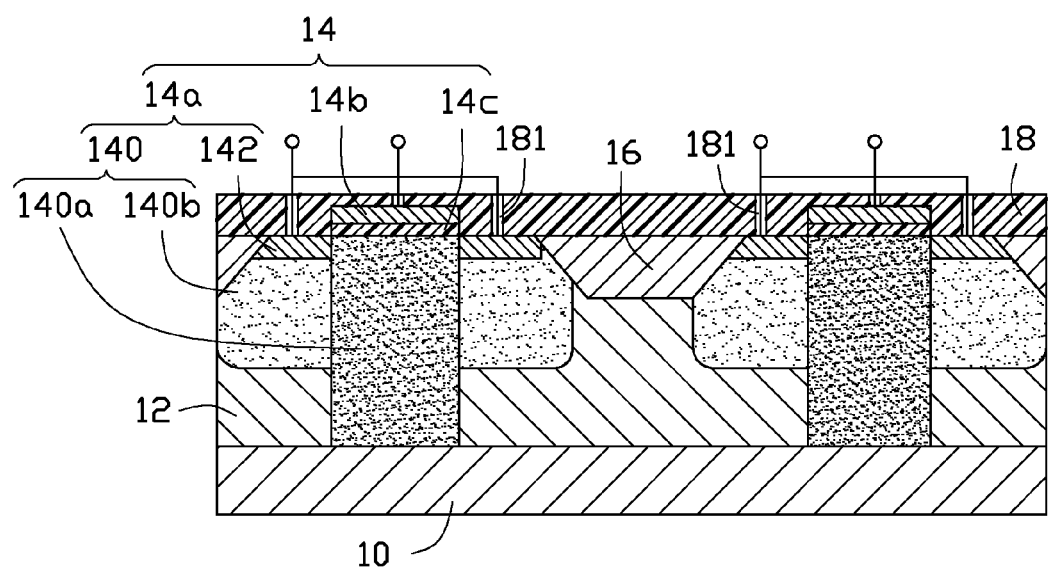
FIG. 1 is a partial perspective illustrating a first embodiment of a semiconductor device including a plurality of semiconductor capacitors, a plurality of isolation elements spacing the semiconductor capacitors, and an insulating layer covering the semiconductor capacitors and the isolation elements according to the present disclosure.

Reference will be made to the drawing to describe specific exemplary embodiments of the present disclosure.

Figure 2:
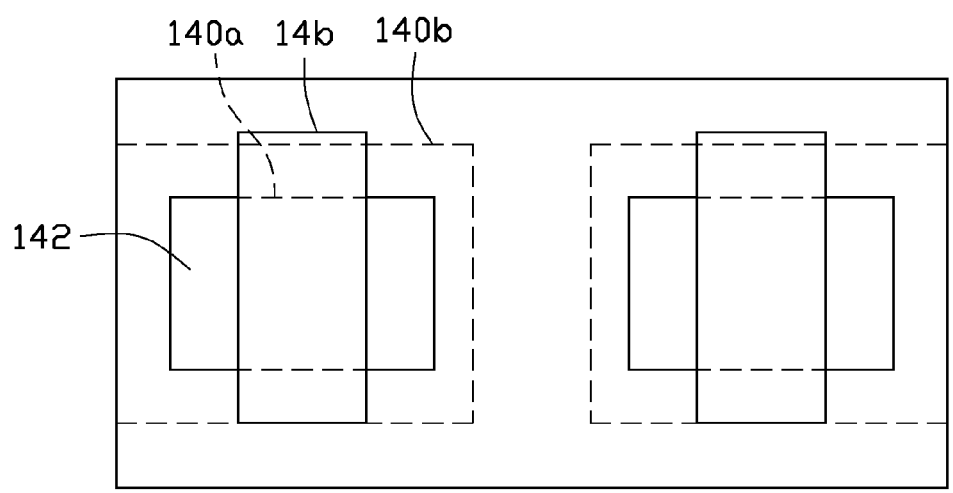
FIG. 2 is a top view of the semiconductor device of FIG. 1 with the isolation elements and the insulating layer of the semiconductor device not being shown.

FIG. 1 is a partial perspective illustrating a first embodiment of a semiconductor device 1 according to the present disclosure. FIG. 2 is a top view of the semiconductor device 1. The semiconductor device 1 includes a substrate 10, a common well 12, a plurality of semiconductor capacitors 14, a plurality of isolation elements 16, and an insulating layer 18. The isolation elements 16 and the insulating layer 18 are shown in FIG. 1, but are not shown in FIG. 2. The semiconductor capacitors 14 may be metal oxide semiconductor (MOS) capacitors, for example. The common well 12 is formed on the substrate 10. The semiconductor capacitors 14 are formed on the common well 12. Every two neighboring semiconductor capacitors 14 are spaced from each other by an isolation element 16 and the common well 12. The insulating layer 18 is formed on the semiconductor capacitors 14 and the isolation elements 16. The insulating layer 18 defines a plurality of contact holes 181 penetrating through the insulating layer 18 and positioned above the semiconductor capacitors 14. Each of the isolation elements 16 may be a shallow trench isolation (STI) layer, or a filed oxide (FOX) layer, or a combination of the STI layer and the FOX layer, for example.

Each of the semiconductor capacitor 14 includes a bottom electrode plate 14a, a top electrode plate 14b, and an insulating layer 14c formed between the bottom electrode plate 14a and the top electrode plate 14b. The top electrode plate 14b may be a poly-crystal silicon layer, for example. The insulating layer 14c may be a silicon oxide layer, for example.

The bottom electrode plate 14a includes a capacitor well 140 and two diffused regions 142. The capacitor well 140 is formed on the common well 12. The two diffused regions 142 are formed on the capacitor well 140 and are spaced from each other by the capacitor well 140. The two diffused regions 142 may be two double diffused drain (DDD) structures, for example. The capacitor well 140 and the two diffused regions 142 each have a first conduction type. A doping concentration of each of the two diffused regions 142 is higher than a doping concentration of the capacitor well 140. The common well 12 has a second conduction type. The first conduction type differs from the second conduction type.

If the semiconductor capacitor 14 is an n-well capacitor, the two diffused regions 142 are n-type heavily doped regions. The capacitor well 140 is an n-type lightly doped region. The common well 12 is a p-type doped region. That is, the first conduction type is an n conduction type, and the second conduction type is a p conduction type. If the semiconductor capacitor 14 is a p-well capacitor, the two diffused regions 142 are p-type heavily doped regions. The capacitor well 140 is a p-type lightly doped region. The common well 12 is an n-type doped region. That is, the first conduction type is a p conduction type, and the second conduction type is an n conduction type.

The capacitor well 140 includes a first well 140a and a second well 140b. In the present embodiment, the first well 140a penetrates the common well 12 and is formed on the substrate 10. The second well 140b is formed on the common well 12 and surrounds the first well 140a. A doping concentration of the first well 140a is higher than a doping concentration of the second well 140b. The two diffused regions 142 are formed above the second well 140b and are spaced from each other by the first well 140a.

The insulating layer 14c and the top electrode plate 14b are formed on the top of the first well 140a in that order. The top electrode plate 14b and the insulating layer 14c extend along a first direction. The first direction is a direction parallel to a Y-axis of an X-Y plane as shown in FIG. 2. The top electrode plate 14b and the insulating layer 14c completely cover the first well 140a along a second direction perpendicular to the first direction, and do not overlap with the two diffused regions 142 along the second direction. The second direction is a direction parallel to an X-axis of the X-Y plane.

In the present embodiment, the top electrode plate 14b and the insulating layer 14c substantially cover the second well 140b along the first direction. One end of each of the top electrode plate 14b and the insulating layer 14c exceeds the second well 140b, the other end of each of the top electrode plate 14b and the insulating layer 14c is aligned with the second well 140b. A shape and an area of the insulating layer 14c are same with a shape and an area of the top electrode plate 14b. The edge of the top electrode plate 14b is aligned with the edge of the insulating layer 14c. In alternative embodiments, the top electrode plate 14b and the insulating layer 14c may partially cover the second well 140b along the first direction, and completely cover the first well 140a in the X-Y plane.

The top electrode plate 14b is connected to a first metal layer (not shown) via a contact hole 181 positioned above the top electrode plate 14b. The two diffused regions 142 are connected to a second metal layer (not shown) different from the first metal layer via two contact holes 181 respectively positioned above the two diffused regions 142. Accordingly, the two diffused regions 142 are electrically connected with each other.

The doping concentration of the first well 140a reaches a predetermined doping concentration, to increase the stability of a capacitance value of the semiconductor capacitor 14. For the semiconductor capacitor 14 having the predetermined doping concentration, the capacitance value of the semiconductor capacitor 14 changes less with an increase of the voltage applied to the semiconductor capacitor 14, even though the semiconductor capacitor 14 operates in a depletion region and an inversion region. The capacitance value of the semiconductor capacitor 14 is substantially constant when the semiconductor capacitor 14 operates in an accumulation area. The semiconductor capacitor 14 having the predetermined doping concentration satisfies a formula:

$$R = \frac{C1 - C2}{C1} \leq 0.7,$$

where C1 is representative of the largest capacitance value of the semiconductor capacitor, C2 is representative of the smallest capacitance value of the semiconductor capacitor, R is representative of a ratio of C1 divided by a difference value of C1 minus C2. For different manufacturing condition, the doping concentration of the first well 140a may be different. The doping concentration of the second well 140b may be the same as a doping concentration of a capacitor well of a semiconductor capacitor manufactured under the same condition.

In the present embodiment, the n-type capacitor is described as an example of the semiconductor capacitor 14. During a process of forming the n-type capacitor, for the second well 140b, n-type ions are doped into the common well 12 once, and the second well 140b is formed. For the first well 140a, n-type ions are doped into the common well 12 at least two times, and the first well 140a is formed. The n-type ions may be phosphorus ions, for example. Alternatively, a process of doping the n-type ion into the common well 12 for forming the second well 140b and a process of doping the n-type ion into the common well 12 for forming the first well 140a are carried out at the same time, and the manufacture conditions, such as the doping concentrations, may be same. Accordingly, the doping concentration of first well 140a via doping the n-type ions into the common well 12 at least two times is higher than the doping concentration of second well 140b via doping the n-type ions into the common well 12 once. In order to make the doping concentration of the semiconductor capacitor 14 reach the predetermined doping concentration, the doping concentration of the first well 140a is correspondingly adjusted. However, a method of making the doping concentration of the high voltage capacitor 14 reach the predetermined doping concentration is not limited to the method of adjusting the doping concentration of the first well 140a.

Similar to the above n-type capacitor, the P-type capacitor is not described in detail here.

Figure 3:
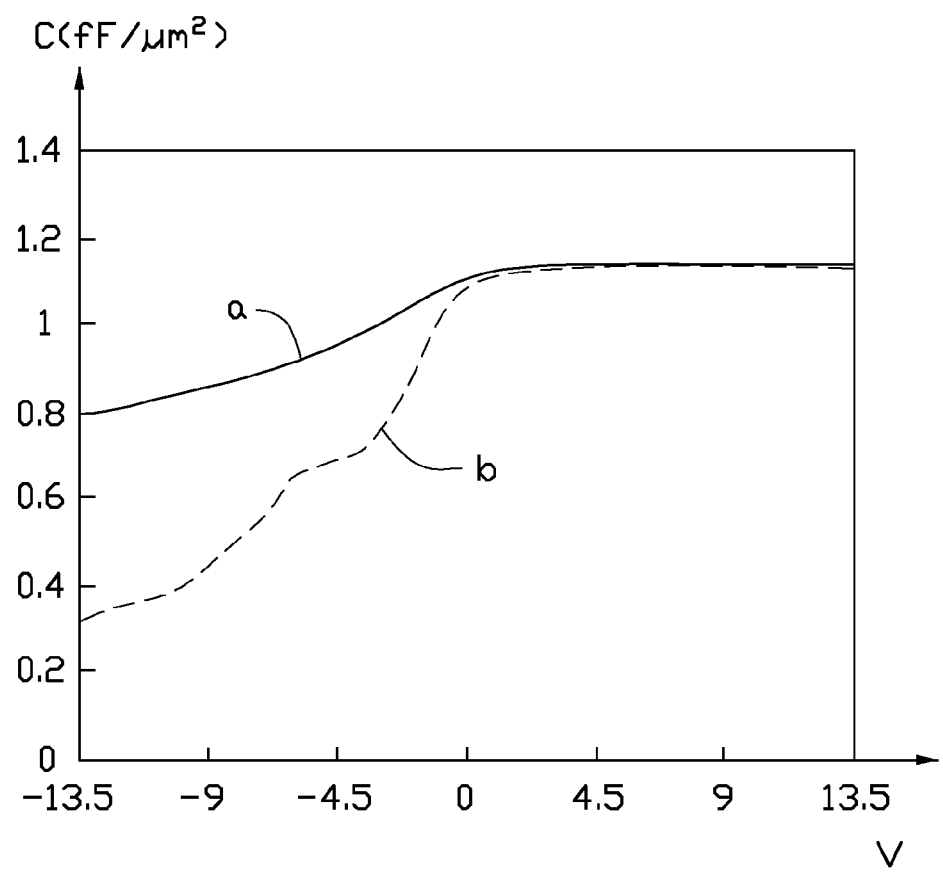
FIG. 3 is a voltage-capacitance curve of one of the semiconductor capacitors of the semiconductor device of FIG. 1.

FIG. 3 is a voltage-capacitance curve of one of the semiconductor capacitors 14 of the semiconductor device 1. In FIG. 3, horizontal coordinates are representative of voltages applied between the top electrode plate 14b and the bottom electrode plate 14a, and longitudinal coordinates are representative of the capacitance values of the semiconductor capacitors 14. The unit of the voltages is volt (V). The unit of the capacitance values is fF/um$^2$ and is represented by a letter "C". A curve "a" is a voltage-capacitance curve of the semiconductor capacitor 14. A curve "b" is a voltage-capacitance curve of the semiconductor capacitor in the prior art. A voltage range [−1V, 0V] is representative of the voltages making a semiconductor capacitor operate in the depletion region. A voltage range [−13.5V, −1V] is representative of the voltages making a semiconductor capacitor operate in the inversion region. A voltage range [0 V, 13.5V] is representative of the voltages making a semiconductor capacitor operate in the accumulation region.

Because the doping concentration of the first well 140a of the semiconductor capacitor 14 is much higher than the doping concentration of the first well of the semiconductor capacitor in the prior art, conductive particles on a surface of the bottom electrode plate 14a increases when the voltage is applied to the semiconductor capacitor 14. Accordingly, the capacitance value of the semiconductor capacitor 14 cannot decrease a lot, even though the semiconductor capacitor 14 operates in the depletion region and the inversion region.

As can be seen from FIG. 3, when the semiconductor capacitor 14 operates in the depletion region and the inversion region, the capacitance value of the semiconductor capacitor 14 changes less with the change of the voltage applied to the semiconductor capacitor 14. By the calculation, for the semiconductor capacitor 14, R=0.3. In contrast, for the semiconductor capacitor in the prior art, R=0.715. Accordingly, for the semiconductor capacitor 14, as long as R is less than 0.715 by adjusting the doping concentration of the first well 140a, the stability of the capacitance value of the semiconductor capacitor 14 is improved.

In the present embodiment, for the semiconductor capacitor 14, R is not more than 0.7 or 0.35. In detail, R may be 0.3, 0.4, 0.5, or 0.6, for example.

Since the doping concentration of the first well 140a of the semiconductor capacitor 14 is much higher, the capacitance value of the semiconductor capacitor 14 can not decrease a lot, when the semiconductor capacitor 14 operates in the depletion region and the inversion region. Accordingly, the quality of the semiconductor capacitor 14 and the semiconductor device 1 employing the semiconductor capacitor 14 can be improved.

Figure 4:
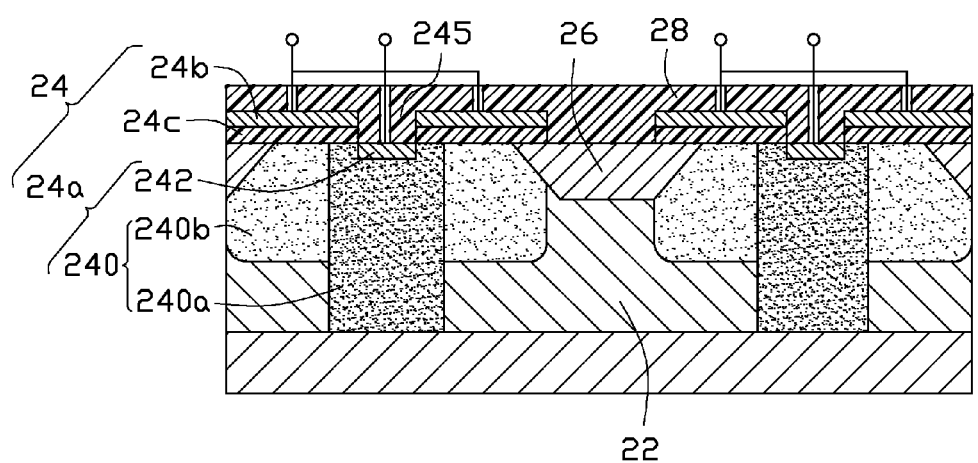
FIG. 4 is a partial perspective illustrating a second embodiment of a semiconductor device including a plurality of semiconductor capacitors, a plurality of isolation elements spacing the semiconductor capacitors, and an insulating layer covering the semiconductor capacitors and the isolation elements according to the present disclosure.
Figure 5:
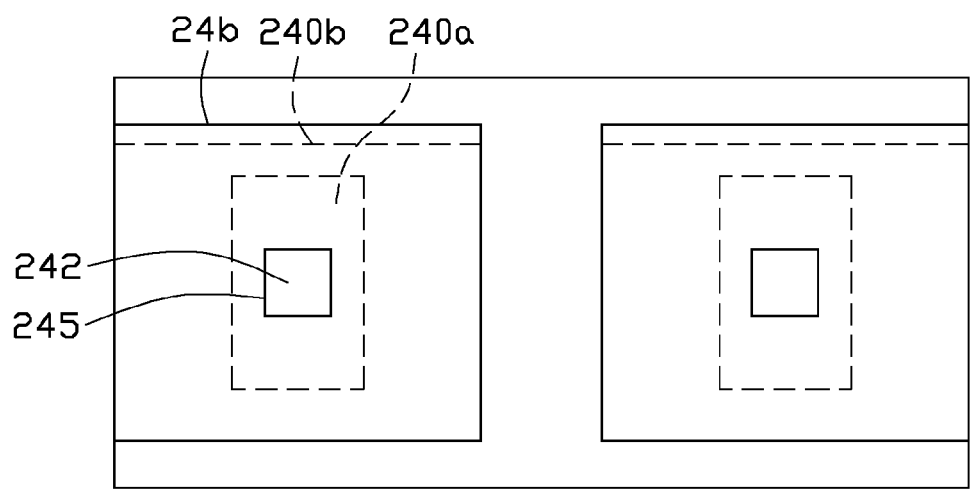
FIG. 5 is a top view of the semiconductor device of FIG. 4 with the isolation elements and the insulating layer of the semiconductor device not being shown.

FIG. 4 is a partial perspective illustrating a second embodiment of a semiconductor device 2 according to the present disclosure. FIG. 5 is a top view of the semiconductor device 2 of FIG. 4. The semiconductor device 2 differs from the semiconductor device 1 of the first embodiment in that semiconductor capacitors 24 of the semiconductor device 2 differ from the semiconductor capacitors 14 of the semiconductor device 1. A plurality of isolation elements 26 spacing the semiconductor capacitors 24, and an insulating layer 28 covering the semiconductor capacitors 24 and the isolation elements 26 of the semiconductor device 2 are shown in FIG. 4, but not shown in FIG. 5.

The semiconductor capacitors 24 are same with each other. One of the semiconductor capacitors 24 is described as an example. The semiconductor capacitor 24 includes a bottom electrode plate 24a, a top electrode plate 24b, and an insulating layer 24c formed between the bottom electrode plate 24a and the top electrode plate 24b.

The bottom electrode plate 24a includes a capacitor well 240 and a diffused region 242. The capacitor well 240 includes a first well 240a and a second well 240b. The second well 240b surrounds the first well 240a. The diffused region 242 is formed above the first well 240a, and does not overlap with the second well 240b.

The top electrode plate 24b and the insulating layer 24c completely cover the second well 240b and partially cover the first well 240a in an X-Y plane shown in FIG. 5. One end of each of the top electrode plate 24b and the insulating layer 24c exceeds the second well 240b along a first direction, the other end of each of the top electrode plate 24b and the insulating layer 24c is aligned with the second well 240b. The first direction is a direction parallel to a Y-axis of the X-Y plane. The top electrode plate 24b and the insulating layer 24c cooperatively define an opening 245 positioned above the first well 240a. The diffused region 242 is exposed from the opening 245 and does not overlap with the top electrode plate 24b and the insulating layer 24c. A shape and an area of the top electrode plate 24b are same with a shape and an area of the insulating layer 24c. The edge of the top electrode plate 24b is aligned with the edge of the insulating layer 24c. In this embodiment, the diffused region 242 only overlaps part of the first well 240a as shown in FIG. 5

Since the top electrode plate 24b almost covers the capacitor well 240 except the diffused region 242 is exposed from the opening 245, an opposite area of the top electrode plate 24b to a bottom electrode plate 24a is increased. Accordingly, a capacitance value of the semiconductor capacitor 24 is not only comparatively stable, but also is much larger than the semiconductor capacitor 14.

In alternative embodiments, the doping concentrations of the second wells 140, 240 instead of the doping concentrations of the first wells 140, 240 are increased, to improve the stability of the semiconductor capacitors 14, 24. In addition, the doping concentrations of the first wells 140, 240, the second wells 140, 240 are all increased.

The first wells 140a and 240a are formed on the common wells 12, 22 respectively, but do not penetrate the common wells 12, 22 respectively.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A capacitor, comprising:
a bottom electrode plate comprising a capacitor well and at least one diffused region formed on the capacitor well, a conduction type of the capacitor well being same with a conduction type of the at least one diffused region, and a doping concentration of the at least one diffused region is higher than a doping concentration of the capacitor well, the capacitor well comprising a first well;
an insulating layer formed on the bottom electrode plate; and
a top electrode plate formed on the insulating layer;
wherein, the capacitance of the capacitor minor changes while operating in a depletion region or in an inversion region, the capacitance of the capacitor being operated in the different regions satisfies a formula:

$$R = \frac{C1 - C2}{C1} \leq 0.7,$$

C1 is representative of a largest capacitance value of the C1 capacitor, C2 is representative of a smallest capacitance value of the same capacitor being operated in a depletion region or in an inversion region, R is representative of a ratio between a difference value of C 1 and C2 and the smallest capacitance value of the capacitor C1, and a value of R is equal to or less than 0.7;
wherein the capacitor well further comprises a common well having a second conduction type and a second well surrounding the first well, the doping concentration of the first well is higher than a doping concentration of the second well; the second conduction type differs from the first conduction type, the common well is formed between the substrate and the capacitor, the first well penetrates the common well and is formed to resist on the substrate, and the second well is formed on the common well.

2. The capacitor according to claim 1, wherein R≤0.35.

3. The capacitor according to claim 2, wherein R=0.3.

4. The capacitor according to claim 1, wherein the top electrode plate is formed above the first well.

5. The capacitor according to claim 4, wherein the at least one diffused region of the bottom electrode plate comprises two diffused regions, the two diffused regions are formed above the second well and are spaced from each other by the first well.

6. The capacitor according to claim 5, wherein the top electrode plate does not overlap with the two diffused regions.

7. The semiconductor device according to claim 1, wherein the at least one diffused region of the bottom electrode plate comprises a diffused region, and the diffused region is formed above the first well.

8. The capacitor according to claim 7, wherein the top electrode plate and the insulating layer cover the capacitor well and cooperatively define an opening above the diffused region.

9. The capacitor according to claim 8, wherein the top electrode plate and the insulating layer do not overlap with the diffused region.

10. A semiconductor device, comprising:
a substrate; and
at least one capacitor formed on the substrate, each of the at least one capacitor comprising: a bottom electrode plate comprising a capacitor well and at least one diffused region formed on the capacitor well, the capacitor well and the at least one diffused region each having a first conduction type, and a doping concentration of the at least one diffused region is higher than a doping concentration of the capacitor well, the capacitor well comprising a first well;
an insulating layer formed on the bottom electrode plate; and
a top electrode plate formed on the insulating layer;
wherein, the capacitance of the capacitor minor changes while operating in a depletion region or in an inversion, such that each of the at least one capacitor satisfies a formula:

$$R = \frac{C1 - C2}{C1} \leq 0.7,$$

C1 is representative of a largest capacitance value of the at least one capacitor being operated in an accumulation area, C2 is representative of a smallest capacitance value of the same at least one capacitor being operated in a depletion region or in an inversion region, R is representative of a ratio between a difference value of C1 and C2 and the smallest capacitance value of the capacitor C1;

wherein the capacitor well further comprises a common well having a second conduction type and a second well surrounding the first well, the doping concentration of the first well is higher than a doping concentration of the second well; the second conduction type differs from the first conduction type, the common well is formed between the substrate and the capacitor, the first well penetrates the common well and is formed to resist on the substrate, and the second well is formed on the common well.

11. The semiconductor device according to claim 10, wherein R≤0.35.

12. The semiconductor device according to claim 11, wherein R=0.3.

13. The semiconductor device according to claim 10, wherein the top electrode plate is formed above the first well, the at least one diffused region of the bottom electrode plate comprises two diffused regions, the two diffused regions are formed above the second well and are spaced from each other by the first well.

14. The semiconductor device according to claim 10, wherein the at least one diffused region of the bottom electrode plate comprises a diffused region, the diffused region is formed above the first well, the top electrode plate and the insulating layer cover the capacitor well and cooperatively define an opening above the diffused region.

15. The semiconductor device according to claim 10, wherein the first conduction type is an n conduction type, and the second conduction type is a p conduction type.

16. The semiconductor device according to claim 10, wherein the first conduction type is a p conduction type, and the second conduction type is an n conduction type.

17. The semiconductor device according to claim 10, further comprising a plurality of isolation elements, wherein the at least one capacitor comprises a plurality of capacitors, and every two neighboring capacitors are spaced from each other by an isolation element and the common well.

* * * * *